(12) United States Patent
Ukawa et al.

(10) Patent No.: US 11,094,676 B2
(45) Date of Patent: Aug. 17, 2021

(54) LIGHT EMITTING DEVICE

(71) Applicant: NICHIA CORPORATION, Anan (JP)

(72) Inventors: Hiroaki Ukawa, Itano-gun (JP);
Atsushi Bando, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 99 days.

(21) Appl. No.: 16/597,262

(22) Filed: Oct. 9, 2019

(65) Prior Publication Data

US 2020/0118982 A1    Apr. 16, 2020

(30) Foreign Application Priority Data

Oct. 12, 2018  (JP) .............................. JP2018-193453

(51) Int. Cl.

| H01L 33/56 | (2010.01) |
| H01L 25/075 | (2006.01) |
| H01L 33/50 | (2010.01) |
| H01L 33/62 | (2010.01) |
| H01L 33/64 | (2010.01) |
| H01L 33/32 | (2010.01) |
| H01L 33/60 | (2010.01) |

(52) U.S. Cl.
CPC ........ *H01L 25/0753* (2013.01); *H01L 33/504* (2013.01); *H01L 33/505* (2013.01); *H01L 33/507* (2013.01); *H01L 33/56* (2013.01); *H01L 33/62* (2013.01); *H01L 33/32* (2013.01); *H01L 33/60* (2013.01); *H01L 33/647* (2013.01); *H01L 2933/0091* (2013.01)

(58) Field of Classification Search
USPC .......................................................... 257/89
See application file for complete search history.

(56) References Cited

U.S. PATENT DOCUMENTS

| 2009/0002604 A1 | 1/2009 | Morimoto |
| 2011/0278605 A1 | 11/2011 | Agatani et al. |
| 2014/0239332 A1 | 8/2014 | Iwakura et al. |
| 2014/0246990 A1 | 9/2014 | Kim et al. |
| 2016/0284950 A1 | 9/2016 | Tseng |
| 2017/0278829 A1 | 9/2017 | Stoll et al. |
| 2018/0042081 A1 | 2/2018 | Kaneko et al. |

FOREIGN PATENT DOCUMENTS

| JP | 2008-283155 A | 11/2008 |
| JP | 2012-004519 A | 1/2012 |
| JP | 2012-199539 A | 10/2012 |

(Continued)

*Primary Examiner* — Elias Ullah
(74) *Attorney, Agent, or Firm* — Foley & Lardner LLP

(57) ABSTRACT

A light-emitting device includes: a first light source including a first light-emitting element having a peak emission wavelength in a range of 430 nm to 480 nm; a second light source including a second light-emitting element having a peak emission wavelength in a range of 430 nm to 480 nm; a third light source; and an encapsulant containing a phosphor. In a 1931 CIE chromaticity diagram, the light-emitting device has: a first chromaticity point when only the first light source is operated, a second chromaticity point different from the first chromaticity point when only the second light source is operated, and a third chromaticity point when only the third light source is operated, the third chromaticity point having a y-value larger than a y-value on a straight line passing the first chromaticity point and the second chromaticity point.

18 Claims, 8 Drawing Sheets

(56) References Cited

FOREIGN PATENT DOCUMENTS

| | | |
|---|---|---|
| JP | 2013-120812 A | 6/2013 |
| JP | 2014-531709 A | 11/2014 |
| JP | 2015-012194 A | 1/2015 |
| JP | 2017-531315 A | 10/2017 |
| WO | WO-2016/147484 A1 | 9/2016 |

[Fig. 1A]
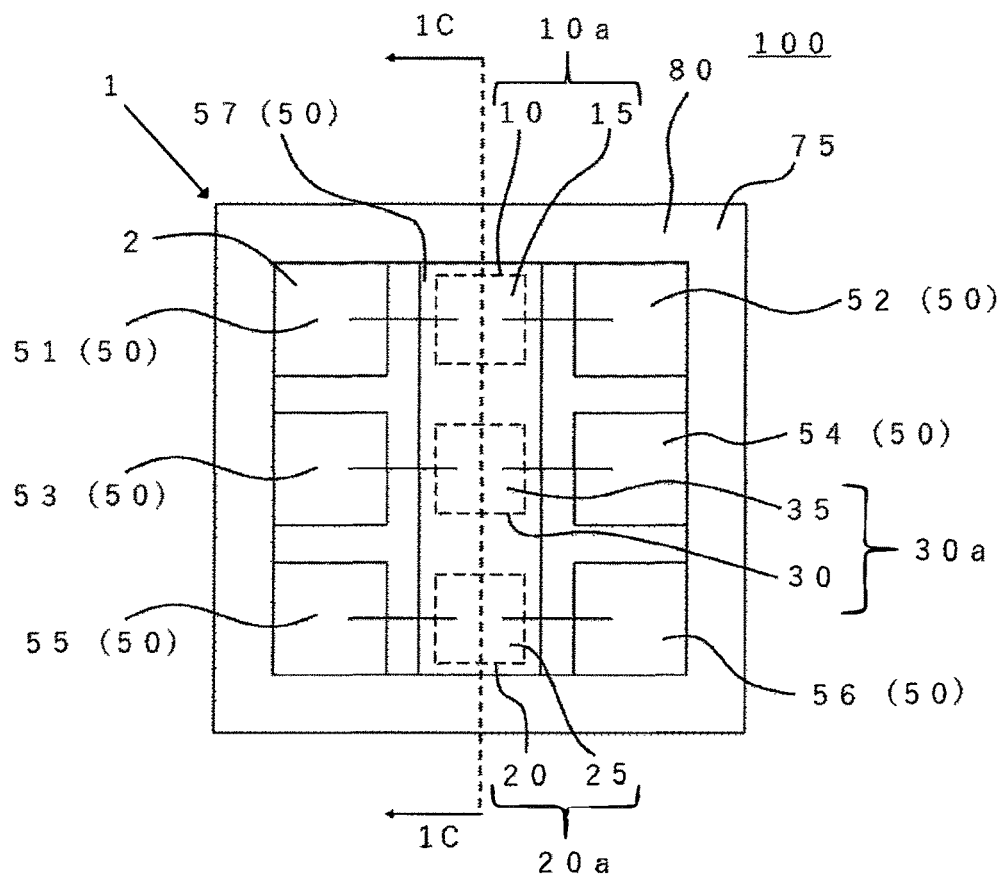
[Fig. 1B]
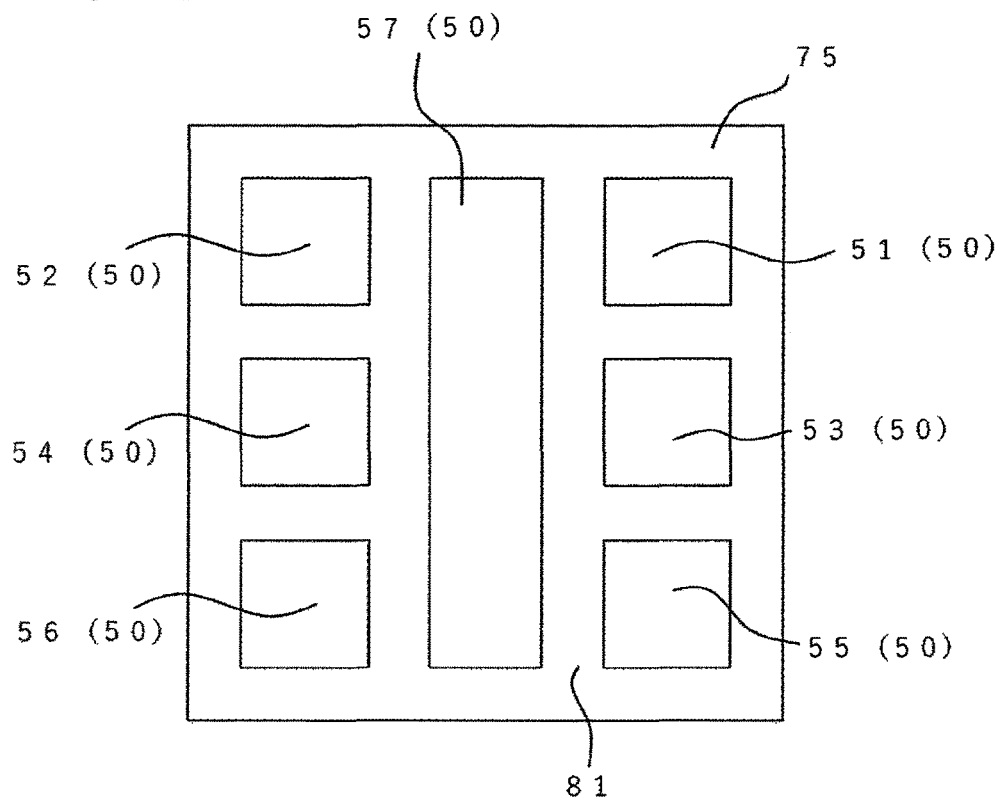

[Fig.1C]
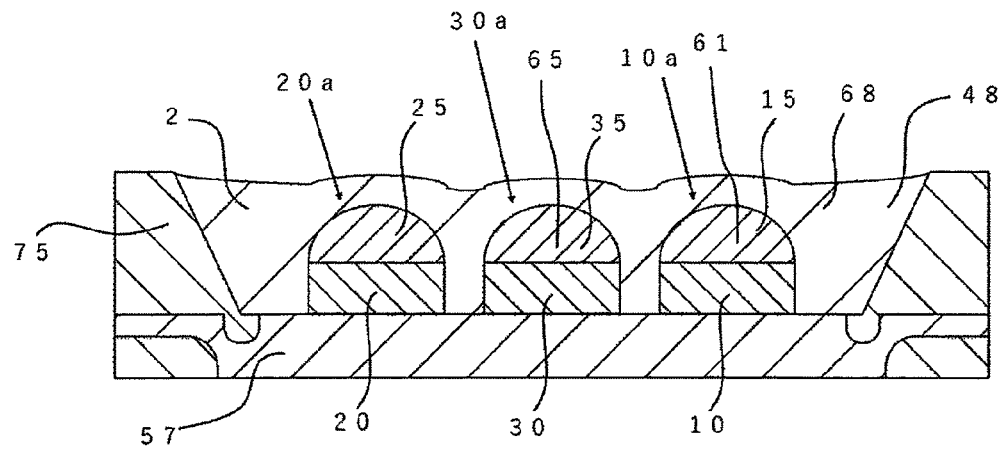
[Fig.2]
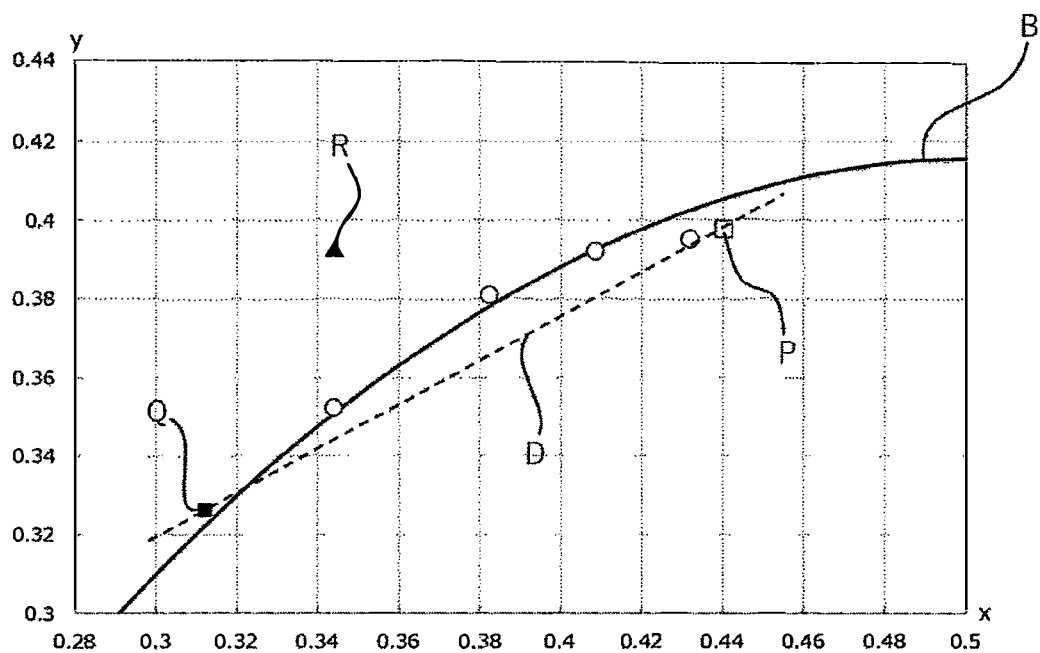

[Fig. 3A]
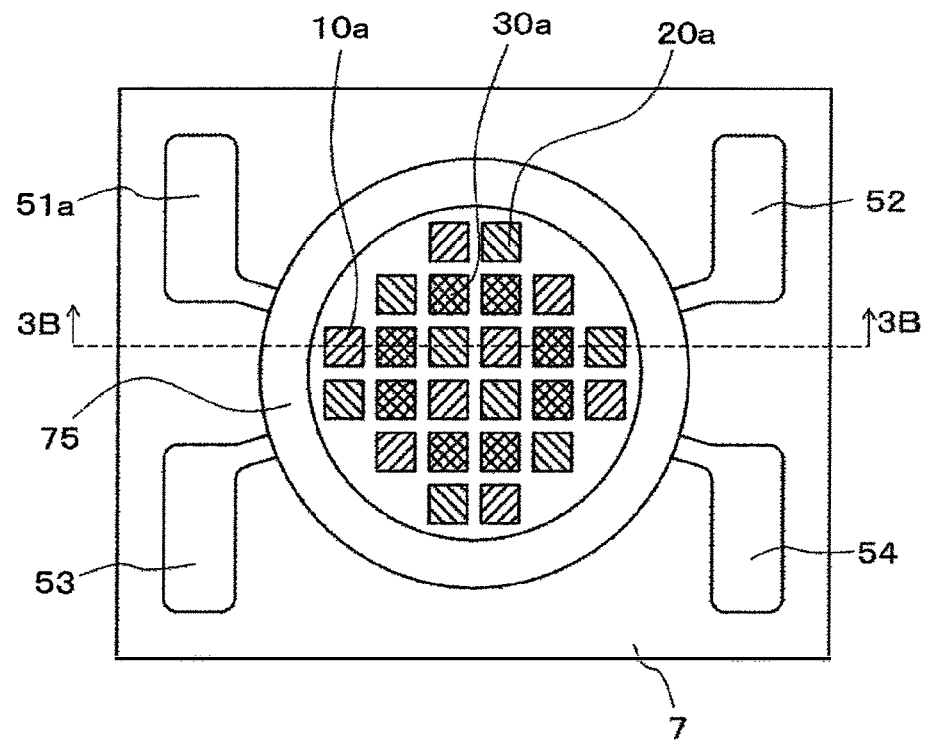
[Fig. 3B]
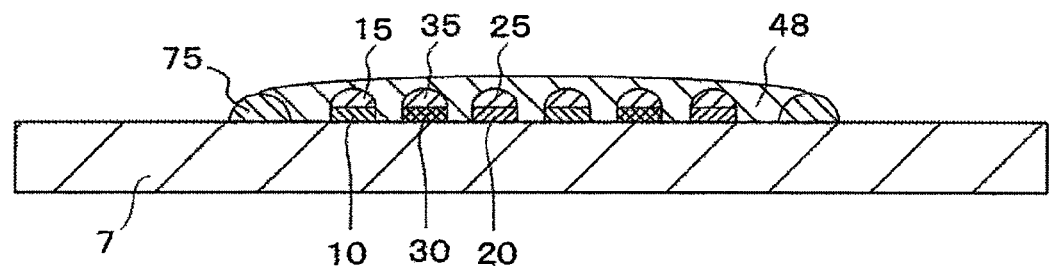

[Fig. 4]
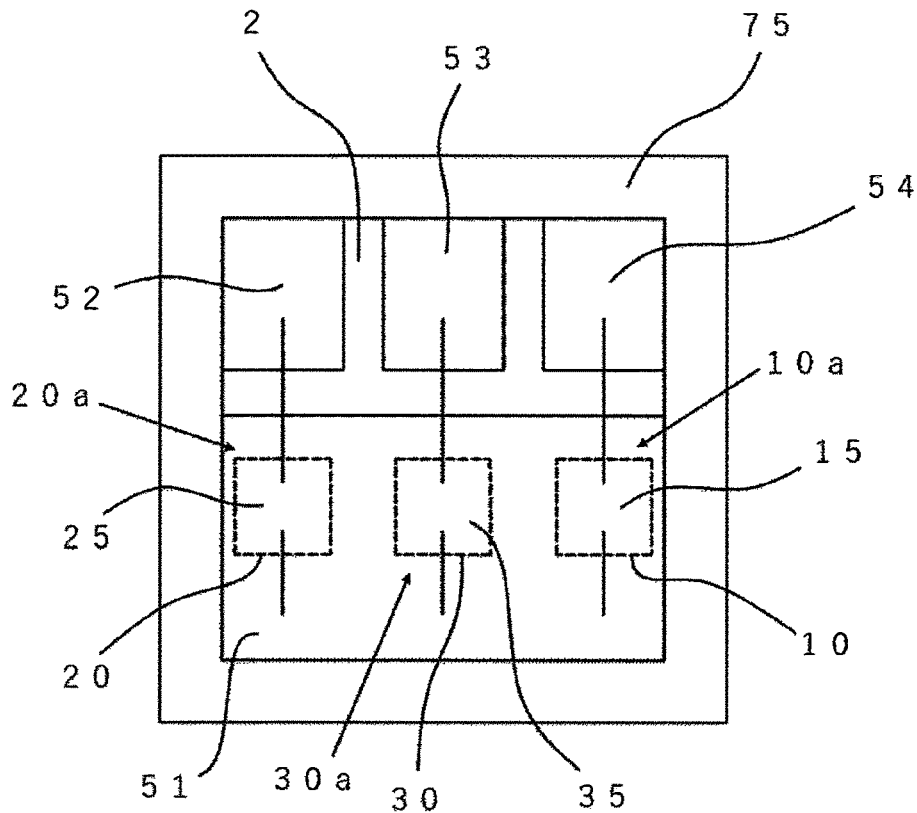
[Fig. 5A]
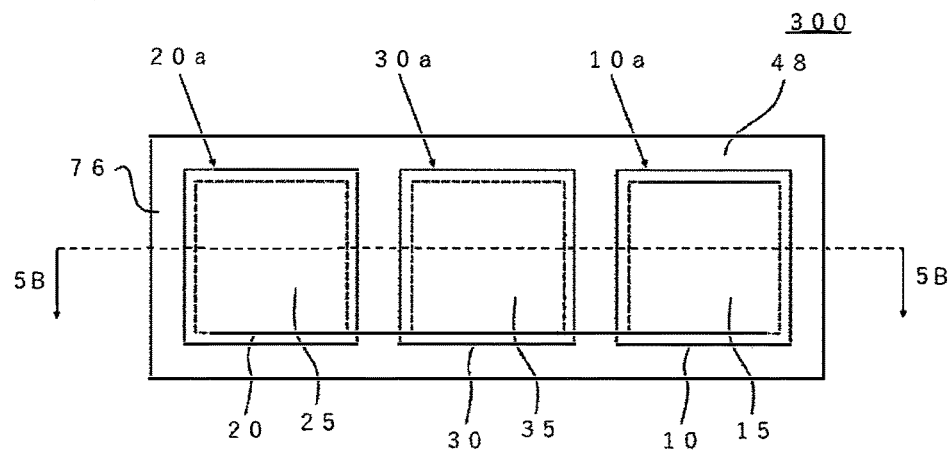
[Fig. 5B]
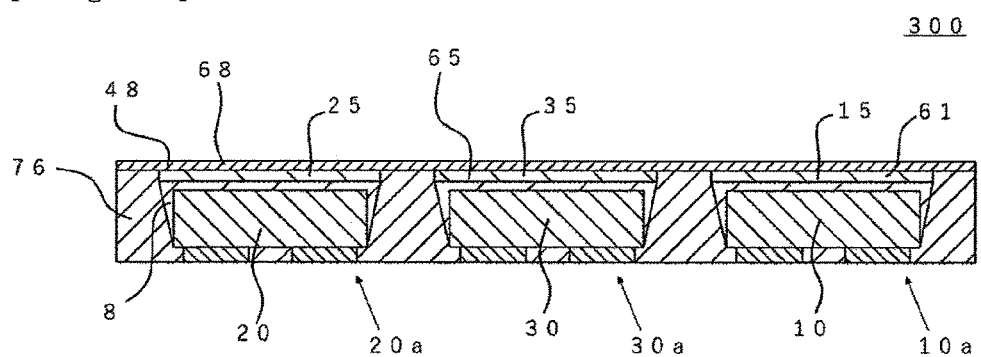

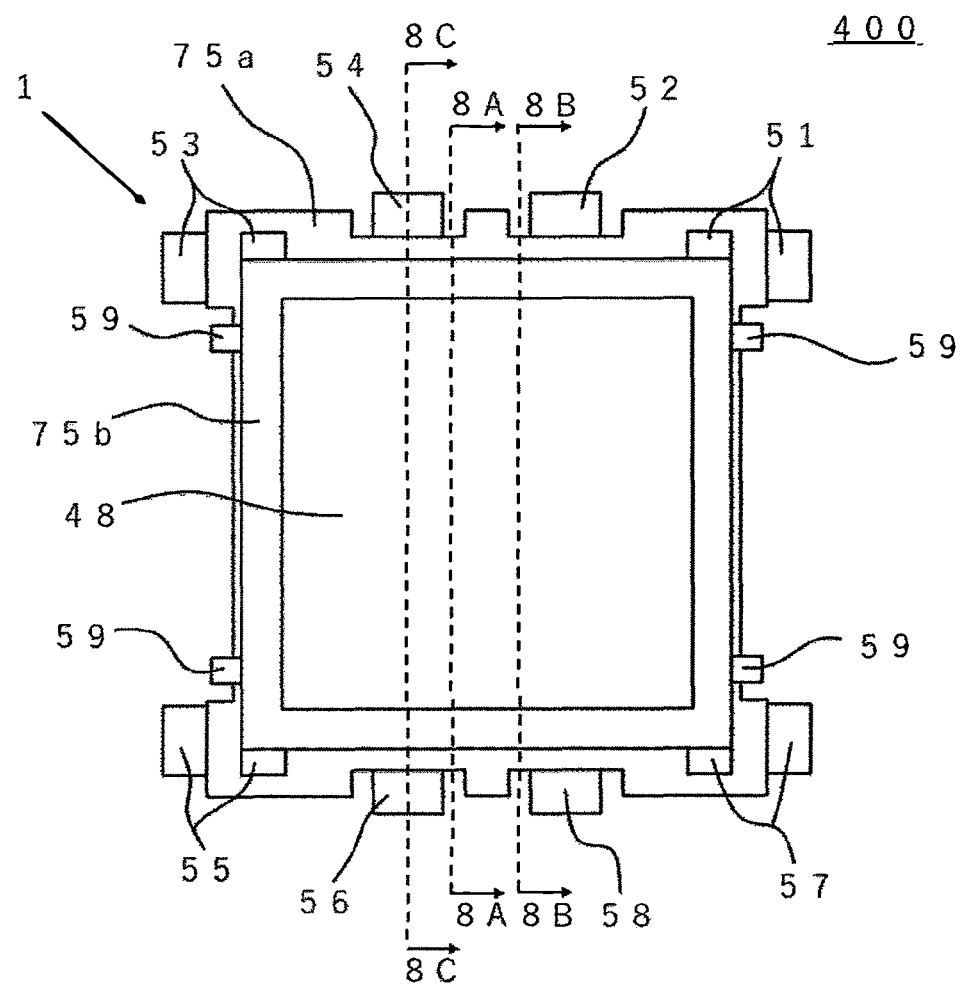

[Fig.6B]
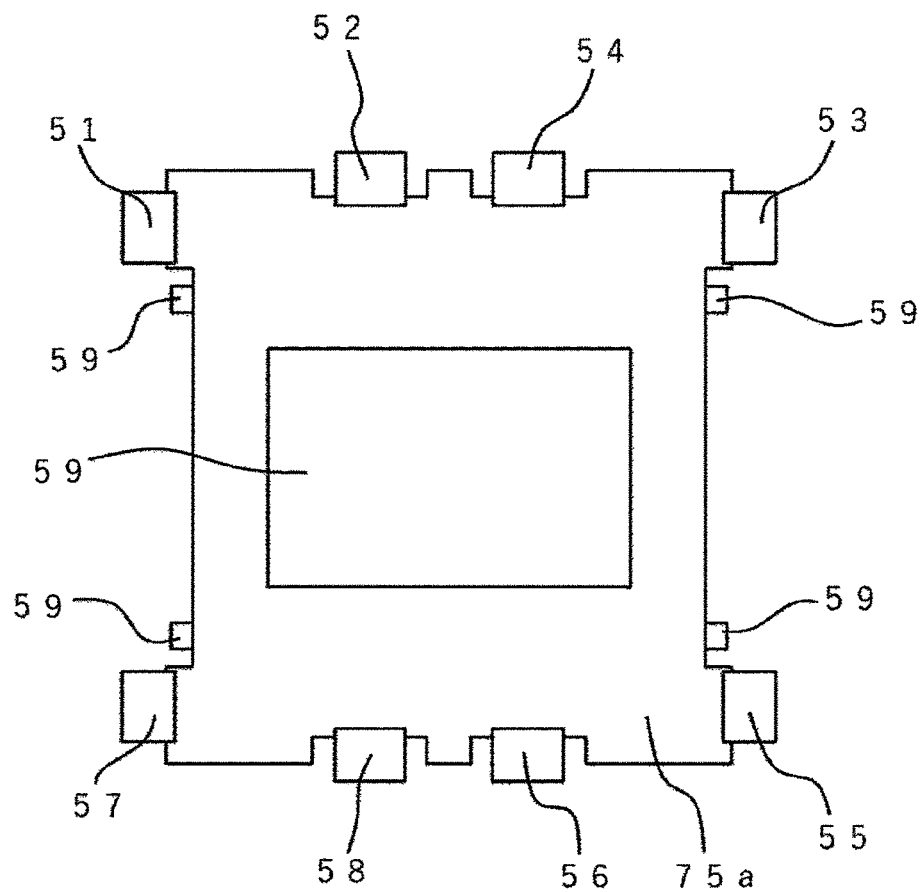
[Fig.7]
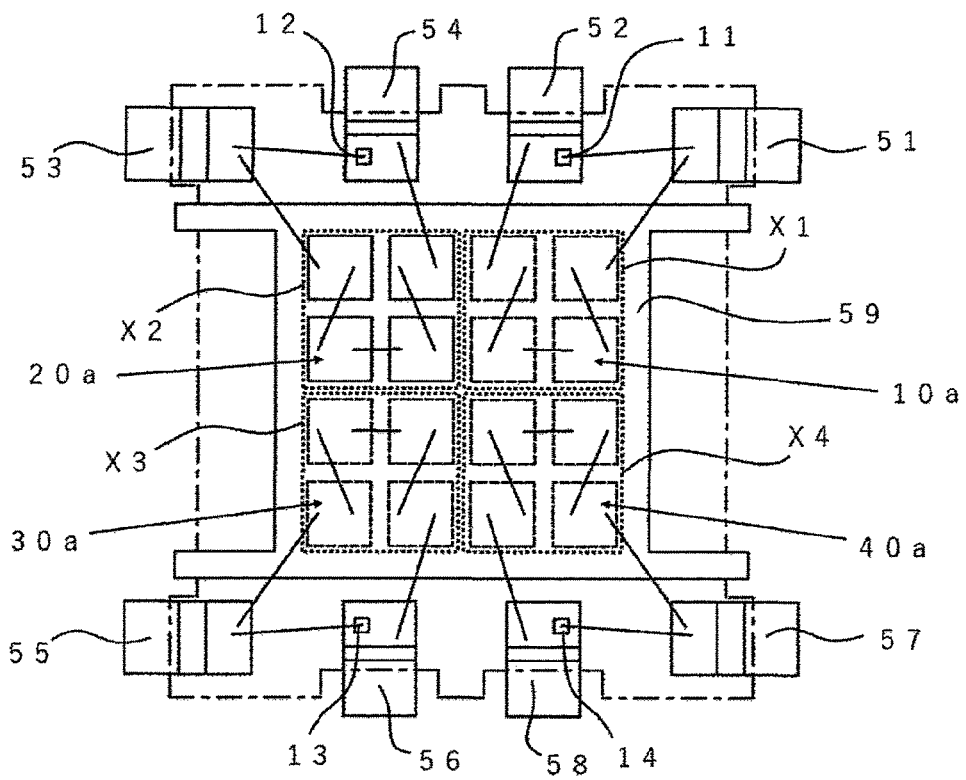

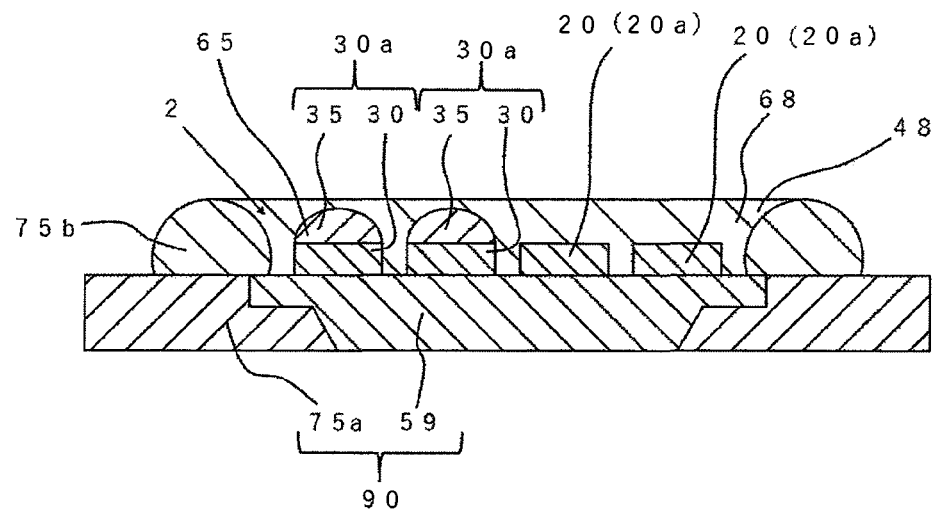
[Fig. 8A]
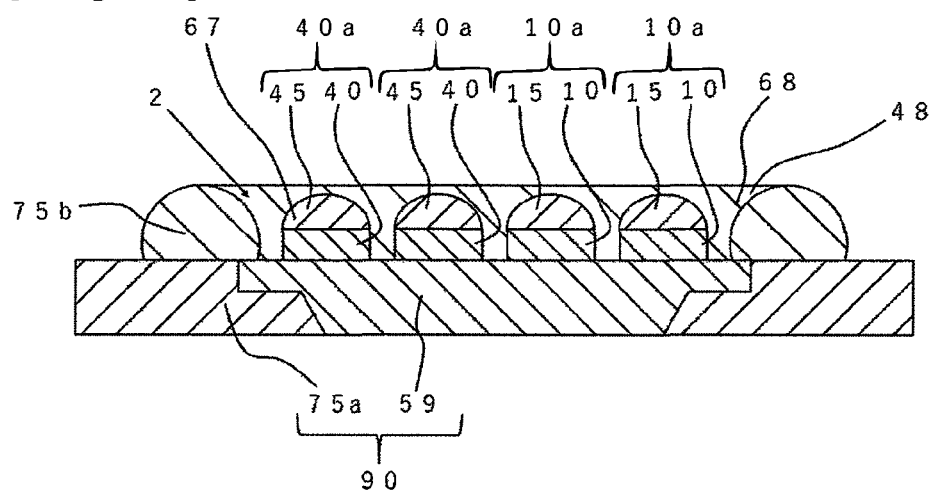
[Fig. 8B]
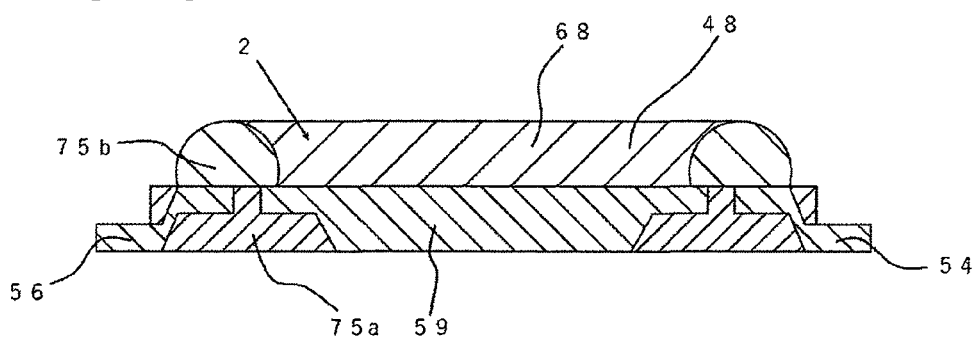
[Fig. 8C]

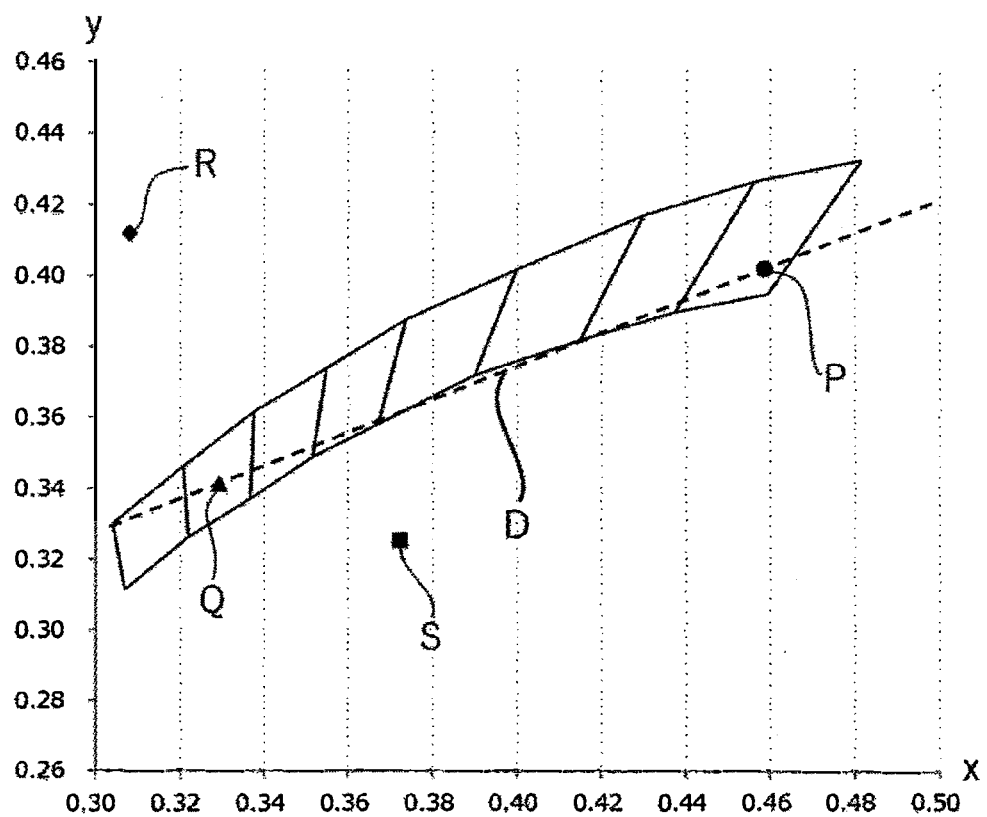
[Fig.9]

LIGHT EMITTING DEVICE

CROSS-REFERENCE TO RELATED APPLICATION

The present application claims priority to Japanese Application No. 2018-193453, filed on Oct. 12, 2018, which is hereby incorporated by reference in its entirety.

BACKGROUND

The present disclosure relates to a light-emitting device.

A light-emitting device having a plurality of independently operable light-emitting elements and phosphor is disclosed, for example, in Japanese Patent Publication No. 2013-120812. In such a light-emitting device, a desired emission color is obtained by adjusting luminous intensity of each light-emitting element.

SUMMARY

However, in the light-emitting device disclosed in Japanese Patent Publication No. 2013-120812, when a current level to each light-emitting element is gradually changed while the total amount of current applied to the light emission device is kept constant, a locus of the chromaticity of the light-emitting device tends to move on a substantially straight line in the 1931 CIE chromaticity diagram. Hence, in the light-emitting device disclosed in Japanese Patent Publication No. 2013-120812, the chromaticity other than the chromaticity on the substantially straight line is difficult to be expressed in the 1931 CIE chromaticity diagram.

An object of certain embodiments of the present disclosure is to provide a light-emitting device that can emit light having a wide range of chromaticity.

According to one embodiment, a light-emitting device includes a first light source including a first light-emitting element having a peak emission wavelength in a range of 430 nm to 480 nm, a second light source including a second light-emitting element having a peak emission wavelength in a range of 430 nm to 480 nm, a third light source, an encapsulant containing a phosphor and covering the first light source, the second light source, and the third light source, each of the first light source, the second light source, and the third light source being connected in parallel, and in a 1931 CIE chromaticity diagram, the light-emitting device having a first chromaticity point when only the first light source is operated, having a second chromaticity point different from the first chromaticity point when only the second light source is operated, and having a third chromaticity point when only the third light source is operated, the third chromaticity point having a y-value larger than a y-value on a straight line passing the first chromaticity point and the second chromaticity point.

According to another embodiment, a light-emitting device includes a first light source including a first light-emitting element having a peak emission wavelength in a range of 430 nm to 480 nm, a second light source including a second light-emitting element having a peak emission wavelength in a range of 430 nm to 480 nm, a third light source that emits light having a peak emission wavelength in a range of 490 nm to 570 nm, an encapsulant containing a phosphor and covering the first light source, the second light source, and the third light source, the first light source, the second light source, and the third light source being connected in parallel, the light-emitting device having a color temperature in a range of 2000 K to 3500 K when only the first light source is operated, and a color temperature in a range of 5000 K to 7500 K when only the second light source is operated.

According to certain embodiments of the present disclosure, a light-emitting device can be provided that can emit light having a wide range of chromaticity.

BRIEF DESCRIPTION OF THE DRAWINGS

FIG. 1A is a schematic top view of a light-emitting device according to a first embodiment of the present invention.

FIG. 1B is a schematic bottom view of a light-emitting device according to the first embodiment of the present invention.

FIG. 1C is a schematic end view taken along the line 1C-1C in FIG. 1A.

FIG. 2 is a diagram showing chromaticity of a light-emitting device in the 1931 CIE chromaticity diagram.

FIG. 3A is a schematic top view of an example of a light-emitting device.

FIG. 3B is a schematic end view taken along the line 3B-3B in FIG. 3A.

FIG. 4 is a schematic top view of an example of a light-emitting device.

FIG. 5A is a schematic top view of an example of a light-emitting device.

FIG. 5B is a schematic end view taken along the line 5B-5B in FIG. 5A.

FIG. 6A is a schematic top view of a light-emitting device according to a second embodiment of the present invention.

FIG. 6B is a schematic bottom view of a light-emitting device according to the second embodiment of the present invention.

FIG. 7 is a schematic top view illustrating a plurality of leads.

FIG. 8A is a schematic end view taken along the line 8A-8A in FIG. 6A.

FIG. 8B is a schematic end view taken along the line 8B-8B in FIG. 6A.

FIG. 8C is a schematic end view taken along the line 8C-8C in FIG. 6A.

FIG. 9 is a diagram showing chromaticity of a light-emitting device in the 1931 CIE chromaticity diagram.

DETAILED DESCRIPTION

Embodiments of the present disclosure will be described below with reference to the accompanying drawings. The following embodiments are illustrative, and the light-emitting device according to the present invention is not limited to the following embodiments. For example, the numerical values, shapes, materials, and the like, shown in the following embodiments are only an example and may be modified unless such a modification is technically inconsistent.

The dimensions, shapes, and the like of the components shown in the drawings may be exaggerated for ease of explanation, and may not represent the dimension, the shape, and the size relationship between components in an actual light-emitting device. The illustration of the components may be partly omitted to prevent the drawings from being too complicated.

In the following description, components having substantially the same function will be shown with the same reference numerals, and repeated descriptions of such components may be omitted. In the following description, terms representing particular directions or positions (e.g., "upper", "lower", and other terms including these words) may be used. These terms are used merely for the sake of ease of explanation, representing relative directions and relative positions in the referenced drawings. As far as the relative directions or positions mentioned by the terms "upper", "lower", and the like designate the same directions or positions in the reference drawings, drawings other than shown in the present disclosure, actual products, and manufacturing equipment may not have the same arrangement as shown in the reference drawings. Relationships between a color name and chromaticity coordinates, between a wavelength range and a color name of monochromatic light, are based on JIS Z8110.

In the following description, for terms such as "package", the same terms may be used before or after disposing a light-emitting element, wires, and the like.

First Embodiment

FIG. 1A is a schematic top view of a light-emitting device 100 according to a first embodiment. FIG. 1B is a schematic bottom view of a light-emitting device 100. FIG. 1C is a schematic end view taken along the line 1C-1C in FIG. 1A. In FIG. 1A, an encapsulant 48 is omitted for easy understanding of the configuration inside a recess 2. Also, on an upper surface of a first light-emitting element 10 and the like, a first light-transmissive member 15 and the like are disposed. Thus, outer edges of the first light-emitting element 10 and the like are shown in dashed lines. The light-emitting device 100 includes a first light source 10a that includes a first light-emitting element 10 having a peak emission wavelength in a range of 430 nm to 480 nm, a second light source 20a that includes a second light-emitting element 20 having a peak emission wavelength in a range of 430 nm to 480 nm, a third light source 30a, an encapsulant 48 containing a phosphor 68 and covering the first light source 10a, the second light source 20a, and the third light source 30a. The first light source 10a, the second light source 20a, and the third light source 30a are connected in parallel.

In the light-emitting device 100 according to the first embodiment, the first light source 10a includes a first light-transmissive member 15 that contains a first phosphor 61 and is disposed on an upper surface of the first light-emitting element 10 and the second light source 20a includes a second light-transmissive member 25 disposed on an upper surface of the second light-emitting element 20. The third light source 30a includes a third light-emitting element 30 and a third light-transmissive member 35 that contains a green phosphor 65 and disposed on an upper surface of the third light-emitting element 30. Also, the light-emitting device 100 includes a package 1 having a recess 2. The first light source 10a, the second light source 20a, and the third light source 30a are disposed on a bottom surface of the recess 2.

Hereinafter, a description of the package 1 will be provided first, followed by descriptions of the first light source 10a, the second light source 20a, and the third light source 30a, and the like.

Package 1

The package 1 is a base to dispose the first light source 10a, the second light source 20a, and the third light source 30a. The package 1 includes a plurality of leads 50 and a resin portion 75 that is integrally formed with the plurality of leads 50. In the light-emitting device 100 according to the first embodiment, the plurality of leads 50 includes a first lead 51 and a second lead 52 that are electrically connected to the first light-emitting element 10, a third lead 53 and a fourth lead 54 that are electrically connected to the second light-emitting element 20, a fifth lead 55 and a sixth lead 56 that are electrically connected to the third light-emitting element 30, and a seventh lead 57 on which the first light-emitting element 10, the second light-emitting element 20, and the third light-emitting element 30 are disposed. The package 1 includes the recess 2. On the bottom surface of the recess 2, upper surfaces of the plurality of leads 50 and a portion of the resin portion 75 are disposed.

The package 1 shown in FIGS. 1A and 1B has an upper surface 80 and a lower surface 81 opposite to the upper surface 80. The package 1 has an outer shape that is substantially rectangular in a top view. At four outer side surfaces, the plurality of leads 50 do not extend outwardly from the resin portion 75. With the plurality of leads 50 not extending outwardly from the resin portion 75 at the four outer side surfaces, the light-emitting device 100 with a small occupying area and compact size can be provided.

The lower surface 81 of the package 1 functions as a mounting surface to mount the light-emitting device 100 on a mounting board. On the lower surface 81 of the package 1, the plurality of leads 50 are exposed from the resin portion 75. This configuration can efficiently dissipate heat generated in the first light source 10a, the second light source 20a, and the third light source 30a from the lower surface 81 of the package 1. Also, on the lower surface 81 of the package 1, lower surfaces of the plurality of leads 50 and a lower surface of the resin portion 75 are formed in a substantially same plane. In a height direction, a difference in height of the lower surfaces of the plurality of leads 50 and the lower surface of the resin portion 75 is, for example, ±10 μm or less.

First Light Source 10a, Second Light Source 20a, Third Light Source 30a

The first light source 10a, the second light source 20a, and the third light source 30a function as light sources of the light-emitting device 100. The first light source 10a includes the first light-emitting element 10 having a peak emission wavelength in a range of 430 nm to 480 nm. The second light source 20a includes the second light-emitting element 20 having a peak emission wavelength in a range of 430 nm to 480 nm. In the light-emitting device 100 according to the first embodiment, the third light source 30a includes the third light-emitting element 30 having a peak emission wavelength in a range of 430 nm to 480 nm. The third light source 30a is used as an auxiliary light source to adjust chromaticity of the light-emitting device 100. The first light-emitting element 10, the second light-emitting element 20, and the third light-emitting element 30 each emits light having a wavelength in a range longer than a near-ultraviolet region. This can suppress issues caused by light in the near-ultraviolet region (for example, adverse effects to human or irradiated objects or large reduction of luminous efficiency of the light-emitting device due to degradation of the components of the light-emitting device, etc.). The first light source 10a, the second light source 20a, and the third light source 30a each having a blue light-emitting element that have substantially the same peak emission wavelength allow for easy designing of the light-emitting device 100 and lighting apparatuses having the light-emitting device 100 and the like.

In the light-emitting device 100 according to the first embodiment, the first light source 10a, the second light source 20a, and the third light source 30a each includes a light-transmissive member. Specifically, as shown in FIG. 1C, the first light source 10a includes the first light-transmissive member 15 disposed on the upper surface of the first light-emitting element 10. The second light source 20a includes the second light-transmissive member 25 disposed on the upper surface of the second light-emitting element 20. The third light source 30a includes the third light-transmissive member 35 disposed on the upper surface of the third light-emitting element 30. In the light-emitting device 100 according to the first embodiment, the first light-transmissive member 15 contains the first phosphor 61. The second light-transmissive member 25 contains substantially no phosphor. This configuration allows chromaticity of light emitted from the first light source 10a to be easily different from chromaticity of light emitted from the second light source 20a. As a result, by individually operating the first light source 10a and the second light source 20a, the light-emitting device 100 can emit light in a wide range of chromaticity. The term "contains substantially no phosphor" means that inevitable mixture of phosphor is not excluded, and the content of the phosphor is, for example, 0.05 weight % or less. In the light-emitting device 100 according to the first embodiment, the third light-transmissive member 35 contains the green phosphor 65.

The first phosphor 61 is, for example, a red phosphor that emits red light. In the 1931 CIE chromaticity diagram, an x-value of chromaticity of light tends to become large in the case of the light having a large red light component. By using a red phosphor for the first phosphor 61, the x-value of the chromaticity of light emitted from the first light source 10a is increased. Hence, with the second light source 20a containing substantially no phosphor or containing a phosphor having a shorter wavelength than the red phosphor, the chromaticity of light emitted from the first light source 10a can readily be differentiated from the chromaticity of light emitted from the second light source 20a. The first phosphor 61 may be, for example, a red phosphor having a broad full width at half maximum. Thus, the color rendering property of the light-emitting device 100 can be increased. The full width at half maximum of the red phosphor is in a range of, for example, 80 nm to 100 nm, preferably 85 nm to 95 nm. The first phosphor 61 may be, for example, a red phosphor having a composition represented by Formula (1) below.

$$(Sr,Ca)AlSiN_3:Eu \tag{1}$$

With the red phosphor having the composition represented by Formula (1), both the color rendering property and the light extraction of the light-emitting device can be increased. The amount of the first phosphor 61 is, for example, 30 wt % to 60 wt % of a total weight of the first light-transmissive member 15.

The second light-transmissive member 25 contains substantially no phosphor. Hence, light emitted from the second light source 20a has a large amount of blue light component emitted mainly from the second light-emitting element 20 (light having a peak emission wavelength in a range of 430 nm to 480 nm). This allows light emitted from the second light source 20a, for example, to have the x-value of the chromaticity relatively smaller than light emitted from the first light source 10a that contains a red phosphor as the first phosphor 61. As a result, the chromaticity of light emitted from the first light source 10a can be readily different from the chromaticity of light emitted from the second light source 20a. Also, with the second light-transmissive member 25 disposed on the upper surface of the second light-emitting element 20, a volume of the encapsulant 48 disposed above the second light-emitting element 20 is reduced and the amount of the phosphor 68 above the second light-emitting element 20 is reduced. Hence, the ratio of light emitted upward from the second light-emitting element 20 to excite the phosphor 68 can be reduced. As a result, for example, in the case in which the phosphor 68 includes a phosphor that emits yellow to red light, the x-value of the chromaticity of light emitted from the second light source 20a becomes relatively smaller than the x-value of the chromaticity of the light-emitting device that does not include the second light-transmissive member 25. This configuration allows chromaticity of light emitted from the first light source 10a to be easily different from chromaticity of light emitted from the second light source 20a.

The third light-transmissive member 35 contains the green phosphor 65. For the phosphor 65, for example, a green phosphor having a broad full width at half maximum may be used. This configuration can increase the color rendering property of the light-emitting device 100. The full width at half maximum of the green phosphor 65 is in a range of, for example, 25 nm to 100 nm, preferably 50 nm to 80 nm. For the green phosphor 65, for example, a green phosphor having a composition represented by Formulas (2) or (3) below may be used.

$$(Sr,Ca,Ba)_4Al_{14}O_{25}:Eu \tag{2}$$

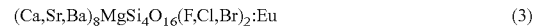

$$(Ca,Sr,Ba)_8MgSi_4O_{16}(F,Cl,Br)_2:Eu \tag{3}$$

With the green phosphor having the composition represented by Formulas (2) or (3), both the color rendering property and the light extraction of the light-emitting device can be increased. In the case of using a green phosphor represented by Formula (2), the green phosphor 65 contains, for example, 20 wt % to 80 wt %, preferably 50 wt % to 64 wt % of a total weight of the third light-transmissive member 35. In the case of using a green phosphor represented by Formula (3), the green phosphor 65 contains, for example, 10 wt % to 60 wt %, preferably 23 wt % to 44 wt % of a total weight of the third light-transmissive member 35.

The first light source 10a, the second light source 20a, and the third light source 30a are connected in parallel. This configuration allows for individual setting of a current level flowing to each of the first light source 10a, the second light source 20a, and the third light source 30a. In the light-emitting device 100 shown in FIG. 1A, the first light source 10a, the second light source 20a, and the third light source 30a are disposed on the upper surface of a seventh lead 57. Also, the first light-emitting element 10 includes a pair of positive and negative electrodes (not shown) on the upper surface. One electrode of the positive and negative electrodes is electrically connected to the first lead 51 via a wire. The other electrode is electrically connected to the second lead 52 via a wire. Likewise, the second light-emitting element 20 includes a pair of positive and negative electrodes (not shown) on the upper surface. One electrode of the positive and negative electrodes is electrically connected to the third lead 53 via a wire. The other electrode is electrically connected to the fourth lead 54 via a wire. Likewise, the third light-emitting element 30 includes a pair of positive and negative electrodes (not shown) on the upper surface. One of the positive and negative electrodes is electrically connected to the fifth lead 55 via a wire. The other is electrically connected to the sixth lead 56 via a wire.

By disposing a pair of electrodes to electrically connect to each light-emitting element, the current level flowing to each light-emitting element becomes readily different from each other. Also, other than the lead that functions as an electrode (hereinafter referred to as an electrode portion), the plurality of leads 50 include a lead that functions as a heat dissipating member (hereinafter referred to as a heat dissipating portion). By disposing the first light-emitting element 10, the second light-emitting element 20, and the third light-emitting element 30 on the upper surface of the heat dissipating portion, the heat generated in the light-emitting element is dissipated from mainly the lower surface of the heat dissipating portion. With this configuration, for example, heat generated in the light-emitting element is conducted to the electrode portion and the encapsulant 48 expands at a portion near a connecting portion of wires and electrodes due to heat. This can suppress disconnection of wires at the connecting portion between the wires and the electrode portion.

In FIG. 2, the chromaticity of the light-emitting device is shown in the 1931 CIE chromaticity diagram when the current level to each light source is changed while the total amount of current applied to the light emission device 100 is kept constant (for example, at 65 mA). In FIG. 2, the chromaticity of the light-emitting device 100 when only the first light source 10a is operated is shown as a first chromaticity point P. The chromaticity of the light-emitting device 100 when only the second light source 20a is operated is shown as a second chromaticity point Q. The chromaticity of the light-emitting device 100 when only the third light source 30a is operated is shown as a third chromaticity point R. The first chromaticity point P, the second chromaticity point Q, and the third chromaticity point R each has a different chromaticity each other. The third chromaticity point R has a y-value higher than a y-value on the line D that passes through the first chromaticity point P and the second chromaticity point Q. In FIG. 2, the blackbody line B is shown.

In FIG. 2, the current levels to each of the first light-emitting element 10, the second light-emitting element 20, and the third light-emitting element 30 are divided into 6 conditions and the chromaticity of the light-emitting device 100 under the six conditions is shown. The six conditions are: the first condition (the first light-emitting element: 65 mA, the second light-emitting element: 0 mA, the third light-emitting element: 0 mA); the second condition (the first light-emitting element: 61 mA, the second light-emitting element: 1 mA, the third light-emitting element: 3 mA); the third condition (the first light-emitting element: 47.5 mA, the second light-emitting element: 2 mA, the third light-emitting element: 15.5 mA); the fourth condition (the first light-emitting element: 34 mA, the second light-emitting element: 10 mA, the third light-emitting element: 21 mA); the fifth condition (the first light-emitting element: 16 mA, the second light-emitting element: 37 mA, the third light-emitting element: 12 mA); and the sixth condition (the first light-emitting element: 0 mA, the second light-emitting element: 65 mA, the third light-emitting element: 0 mA). The chromaticity of the light-emitting device under the first condition is the first chromaticity point P. The chromaticity of the light-emitting device under the sixth condition is the second chromaticity point Q.

When only the first light source 10a is operated, the light from the first light source 10a and the light from the phosphor 68 in the encapsulant 48 are mixed. Hence, for example, the light-emitting device 100 can emit light with an emission color in a color temperature range of 2000 K to 3500 K. When only the second light source 20a is operated, the light from the second light source 20a and the light from the phosphor 68 in the encapsulant 48 are mixed. Hence, for example, the light-emitting device 100 can emit light with an emission color in a color temperature range of 5000 K to 7500 K. Further, by adjusting current levels to the first light source 10a, the second light source 20a, and the third light source 30a, the light-emitting device 100 can have an emission color in a color temperature range of 2000 K to 7500 K. This allows the light-emitting device to emit light in a wide range of correlated color temperatures.

The locus of the chromaticity of the light-emitting device 100 on the 1931 CIE chromaticity diagram is a curve projecting in the +y direction as shown in FIG. 2. In the case of the light-emitting device having only the first light source and the second light source, when the current levels to the first light source and the second light source are gradually changed while the total amount of current applied to the light emission device is kept constant, the locus of the chromaticity of the light-emitting device tends to be on a substantially straight line (for example, on a line D) in the 1931 CIE chromaticity diagram. However, the light-emitting device according to the present disclosure includes the third light source 30a in addition to the first light source 10a and the second light source 20a. By adjusting the current level that flows to each of the first light source 10a, the second light source 20a, and the third light source 30a, the chromaticity other than the chromaticity on the substantially straight line in the 1931 CIE chromaticity diagram can be expressed. In other words, the light-emitting device 100 can be adjusted to reproduce an emission color at a desired chromaticity point. This allows, for example, an emission color of the light-emitting device 100 to be adjusted along the blackbody locus B in the 1931 CIE chromaticity diagram.

The light-emitting device 100 according to the present disclosure may include a light source to which current is not applied. For example, as in the case of the first chromaticity point P and the second chromaticity point Q, the light-emitting device 100 may be such that current is applied only to the first light source 10a or the second light source 20a while current is not applied to other light sources.

In the 1931 CIE chromaticity diagram, the x-value of the third chromaticity point R is preferably located between the x-value of the first chromaticity point P and the x-value of the second chromaticity point Q. This inhibits the first chromaticity point P and the second chromaticity point Q, each serving as a standard chromaticity point, from shifting toward the y direction. As a result, the current level to obtain the desired chromaticity can be adjusted easily in the light-emitting device 100. In the 1931 CIE chromaticity diagram, the y-value of the third chromaticity point R is preferably larger than the y-value of the first chromaticity point P and the y-value of the second chromaticity point Q. Hence, by applying current to the third light source 30a, the y-value of each chromaticity can be increased from the first chromaticity point P to the second chromaticity point Q. FIG. 2 indicates a case in which the y-value of the third chromaticity point R is located between the y-value of the first chromaticity point P and the y-value of the second chromaticity point Q.

In the 1931 CIE chromaticity diagram, an absolute value of Duv of the light-emitting device 100 from the first chromaticity point P to the second chromaticity point Q is preferably 0.02 or less. Hence, a color difference at the same color temperature between the emission color of the light-emitting device 100 and the emission color on a blackbody locus becomes small, and the light-emitting device having a high-quality emission color can be provided.

The first light source 10a, the second light source 20a, and the third light source 30a preferably have no partition member such as a wall between each other. This can increase color mixing property of the light-emitting device 100. Specifically, the light-emitting device 100 shown in FIG. 1A includes the first light source 10a, the second light source 20a, and the third light source 30a in a housing member (inside the recess 2) and no partition member is disposed between the first light source 10a, the second light source 20a, and the third light source 30a. With this configuration, the light from each of the first light source 10a, the second light source 20a, and the third light source 30a can be readily mixed and a light-emitting device with good color mixing property can be provided. The first light source 10a, the second light source 20a, and the third light source 30a may include a partition member such as a wall between each other. In this case, for example, the partition member such as a wall may have an upper surface that is disposed lower than the upper surface of the light source.

The third light source 30a is preferably located between the first light source 10a and the second light source 20a in a top view. This allows light emitted from the third light source 30a to be emitted toward both the first light source 10a and the second light source 20a and color mixing property of the light-emitting device 100 can be increased.

Encapsulant 48

The encapsulant 48 covers the first light source 10a, the second light source 20a, and the third light source 30a. In the light-emitting device 100 shown in FIG. 1C, the encapsulant 48 is disposed inside the recess 2 to cover the upper surface of the first light-transmissive member 15, the upper surface of the second light-transmissive member 25, the upper surface of the third light-transmissive member 35, the lateral surface of the first light-emitting element 10, the lateral surface of the second light-emitting element 20, and the lateral surface of the third light-emitting element 30. With the encapsulant 48 covering the first light source 10a, the second light source 20a, and the third light source 30a, the light emitted from each of the first light source 10a, the second light source 20a, and the third light source 30a can be readily mixed in the encapsulant 48 and a light-emitting device with good color mixing property can be provided.

The encapsulant 48 includes the phosphor 68. The phosphor 68 may include a single type of phosphor or multiple types of phosphors. With multiple types of phosphors, color rendering property of the light-emitting device 100 can be increased. The phosphor 68 may include, for example, a phosphor having a composition represented by Formula (4) or Formula (5) below. Alternatively, the phosphor 68 may include both phosphors with the composition represented by Formula (4) and Formula (5) below.

$$(Y,Lu,Gd)_3(Al,Ga)_5O_{12}:Ce \quad (4)$$

$$(Sr,Ca)AlSiN_3:Eu \quad (5)$$

Components of the light-emitting device 100 according to the present invention will be described below in more detail.

First Light Source, Second Light Source, Third Light Source

The first light source 10a, the second light source 20a, and the third light source 30a function as light sources of the light-emitting device 100. The first light source 10a, the second light source 20a, and the third light source 30a each includes a light-emitting element. A light-emitting diode element that includes a nitride semiconductor ($In_xAl_yGa_{1-x-y}N$, $0 \leq x$, $0 \leq y$, $x+y \leq 1$) can be used as the light-emitting element.

The first light-emitting element 10 and the second light-emitting element 20 each has a peak emission wavelength in a range of 430 nm to 480 nm. The first light-emitting element 10 and the second light-emitting element 20 have wavelengths in a range longer than a near-ultraviolet region. This can suppress issues caused by light in the near-ultraviolet region (for example, adverse effects to human or irradiated objects or large reduction of luminous efficiency of the light-emitting device due to degradation of the components of the light-emitting device, etc.). The first light-emitting element 10 and the second light-emitting element 20 each include at least one light-emitting element. However, each may include two or more light-emitting elements.

The third light source 30a may include a green light-emitting element to emit green light or a third light-emitting element 30 having a peak emission wavelength in a range of 430 nm to 480 nm and a third light-transmissive member 35 that contains a green phosphor 65 on an upper surface of the third light-emitting element 30. The green light-emitting element is a light-emitting element having a peak emission wavelength in a range of 490 nm to 570 nm. The green light-emitting element and the third light-emitting element 30 each include at least one light-emitting element. However, each may include two or more light-emitting elements. Also, the third light source 30a may include both the green light-emitting element and the third light-emitting element 30.

The third light source 30a is not limited to a light source that emits green light. That is, in the 1931 CIE chromaticity diagram, the third light source 30a may be such that when only the third light source 30a is operated, a y-value of the third chromaticity point R of the light source is higher than a y-value on the line D that passes through the first chromaticity point P and the second chromaticity point Q, which are the chromaticity points when only the first light source 10a is operated and when only the second light source 20a is operated, respectively. In this case, the terms "having a y-value higher than a y-value on the line D" means that the third chromaticity point R is located upward from the line D in the 1931 CIE chromaticity diagram.

The first light-emitting element 10, the second light-emitting element 20, and the third light-emitting element 30 each can have a substantially same peak emission wavelength (for example, with a tolerance of 5 nm). Two or three of the first light-emitting element 10, the second light-emitting element 20, and the third light-emitting element 30 may have a peak emission wavelength with a difference of 10 nm from each other.

First Light-Transmissive Member, Second Light-Transmissive Member, and Third Light-Transmissive Member On the upper surface of the first light-emitting element 10 and the like (hereinafter referred to as the light-emitting element), the first light-transmissive member 15 and the like (hereinafter referred to as the light-transmissive member) may be disposed. The light-transmissive member may be in contact with the upper surface of the light-emitting element, or the light-transmissive member may be indirectly disposed above the light-emitting element with another member such as a protective layer disposed between the light-transmissive member and the upper surface of the light-emitting element.

The light-transmissive member preferably covers only the upper surface of the light-emitting element. In other words, the light-transmissive member preferably covers the upper surface of the light-emitting element and does not cover the lateral surface of the light-emitting element. This allows the phosphor 68 to be effectively excited by the light emitted toward the lateral side of the light-emitting element when a phosphor having a high excitation efficiency is used as the phosphor 68 in the encapsulant 48. As a result, a light-emitting device with good light extraction can be achieved.

Also, in the case of applying a liquid resin material that constitutes the light-transmissive member on the upper surface of the light-emitting element, surface tension acts at the edge of the upper surface of the light-emitting element to keep the resin material inside an edge of the light-emitting element. With this configuration, when a plurality of light-emitting devices are manufactured, the light-transmissive member can be stably formed into a shape and manufacturing yield can be increased. With the light-transmissive member to be stably formed, a light-emitting device having desired light distribution.

The light-transmissive member can cover the lateral surface of the light-emitting element. With the light-transmissive member covering the upper surface and the lateral surface of the light-emitting element, color unevenness can be prevented between the light emitted to the upper direction and the light emitted to the lateral direction of the light-emitting element.

The light-transmissive member may be formed by various methods. For example, the light-transmissive member may be formed by printing, potting, spraying, or the like using the resin material, or formed by attaching a sheet-shaped or a block-shaped resin member with an adhesive and the like. Also, the light-transmissive member that contains the phosphor may be formed by, for example, electrophoretic deposition and the like.

The first light-transmissive member 15, the second light-transmissive member 25, and the third light-transmissive member 35 are preferably separated each other. In the light-emitting device 100 shown in FIG. 1C, a portion of the encapsulant 48 is disposed between the first light-transmissive member 15, the second light-transmissive member 25, and the third light-transmissive member 35. With the first light-transmissive member 15, the second light-transmissive member 25, and the third light-transmissive member 35 not constituting a continuous member, mutual interference of the light emitted from the first light source 10a, the light emitted from the second light source 20a, and the light emitted from third light source 30a can be prevented. As a result, the chromaticity of each of the first light source 10a, the second light source 20a, and the third light source 30a can be readily adjusted independently.

The light-transmissive member may be formed into various shapes. The light-transmissive member may have a substantially semicircular, or a substantially semielliptical shape in a section view as shown in FIG. 1C. In other words, the whole upper surface of the light-transmissive member preferably has a curved surface projecting upward. This configuration can prevent the light emitted from the light-emitting element to be reflected at the surface of the light-transmissive member and returned to the light-emitting element.

The first light-transmissive member 15, the second light-transmissive member 25, and the third light-transmissive member 35 may have the same height or a different height in a height direction. For example, in a height direction, a portion of the light-transmissive member may have a height higher than the height of the other light-transmissive member. This configuration can increase an amount of the phosphor to be contained in a portion of the light-transmissive member.

The first light-transmissive member 15 and the second light-transmissive member 25 may contain a phosphor and light scattering particles. In the light-emitting device 100 according to the first embodiment, the first light-transmissive member 15 contains the first phosphor 61. The second light-transmissive member 25 contains substantially no phosphor. However, the light-emitting device according to the present disclosure is not limited to the above embodiment. For example, the first light-transmissive member 15 contains substantially no phosphor and the second light-transmissive member 25 may contain the second phosphor. Alternatively, the first light-transmissive member 15 may contain the first phosphor 61 and the second light-transmissive member 25 may contain the second phosphor.

The first phosphor 61 and the second phosphor may be a phosphor having the same composition. In the case of using a phosphor for the first phosphor 61 and the second phosphor each having the same composition, the amount of the first phosphor 61 contained in the first light-transmissive member 15 is different from the amount of the second phosphor contained in the second light-transmissive member 25. For example, in the case of using a red phosphor for the first phosphor 61 and the second phosphor each having the same composition, by differentiating the amounts of phosphors, the x-value of the chromaticity of light emitted from the phosphor having more amount of the red phosphor can be increased. By using a phosphor for the first phosphor 61 and the second phosphor each having the same composition, the chromaticity of light emitted from each light-transmissive member can be readily adjusted.

In another example, the first phosphor 61 is a phosphor that emits light having a long wavelength, and the second phosphor is a phosphor that emits light having a short wavelength. For example, a red phosphor that emits red light is used for the first phosphor 61, and a phosphor that emits blue to green light is used for the second phosphor. This configuration allows the x-value of the chromaticity of light emitted from the first light-transmissive member 15 to be largely different from the x-value of the chromaticity of light emitted from the second light-transmissive member 25.

A thermosetting resin, a thermoplastic resin, or the like can be used for a resin material to serve as a base material of the first light-transmissive member 15, the second light-transmissive member 25, and the third light-transmissive member 35. Specifically, examples of the base material include an epoxy resin compound, a silicone resin compound, a modified epoxy resin compound such as a silicone-modified epoxy resin, a modified silicone resin compound such as epoxy-modified silicone resin, an unsaturated polyester resin, a saturated polyester resin, a polyimide resin compound, a modified polyimide resin compound, cured products of the above resin compounds, polyphthalamide (PPA), polycarbonate resin, polyphenylene sulfide (PPS), a liquid crystal polymer (LCP), a resin such as an ABS resin, a phenolic resin, an acrylic resin and a PBT resin. Particularly, a silicone resin compound and an epoxy resin compound are preferably used. In the first light-transmissive member 15, the second light-transmissive member 25, and the third light-transmissive member 35, light scattering particles such as titanium oxide, silicon oxide, zirconium oxide, or aluminum oxide may be dispersed.

The first phosphor 61 and the second phosphor may be a phosphor to be excited by the light from the light-emitting element. Examples of the phosphors can include $(Ca,Sr,Ba)_5(PO_4)_3(Cl,Br):Eu$, $(Sr,Ca,Ba)_4Al_{14}O_{25}:Eu$, $(Ca,Sr,Ba)_8MgSi_4O_{16}(F,Cl,Br)_2:Eu$, $(Y,Lu,Gd)_3(Al,Ga)_5O_{12}:Ce$, $(Sr,Ca)AlSiN_3:Eu$, $3.5MgO \cdot 0.5MgF_2 \cdot GeO_2:Mn$, $(x\text{-}s)MgO \cdot (s/2)Sc_2O_3 \cdot yMgF_2 \cdot uCaF_2 \cdot (1\text{-}t)GeO_2 \cdot (t/2)M^r_2O_3:zMn$, $Ca_3Sc_2Si_3O_{12}:Ce$, $CaSc_2O_4:Ce$, $(La,Y)_3Si_6N_{11}:Ce$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Ca,Sr,Ba)_2Si_5N_8:Eu$, $(Ca,Sr,Ba)S:Eu$, $(Ba,Sr,Ca)Ga_2S_4:Eu$, and $K_2(Si,Ti,Ge)F_6:Mn$.

Examples of a green phosphor can include $(Sr,Ca,Ba)_4Al_{14}O_{25}:Eu$, $(Ca,Sr,Ba)_8MgSi_4O_{16}(F,Cl,Br)_2:Eu$, and $Si_{6-z}Al_zO_zN_{8-z}:Eu(0<z<4.2)$.

Other than a resin material, the first light-transmissive member 15, the second light-transmissive member 25, and the third light-transmissive member 35 may be formed by a sintered body of ceramic, glass, a phosphor, or the like. These materials can improve reliability of the light-emitting device for a high-output light-emitting device.

Encapsulant

The light-emitting device 100 includes the encapsulant 48 that covers the first light source 10a, the second light source 20a, and the third light source 30a. The encapsulant 48 can protect the light source and the like from external forces, dust, and moisture, and the like. The encapsulant 48 preferably transmits 60% or more, more preferably 90% or more of the light emitted from the light source. As a base material for the encapsulant 48, a resin material that is used the first light-transmissive member can be used. The resin material to serve as the base material may include a thermosetting resin, a thermoplastic resin, and the like. Examples of such materials may include a silicone resin, an epoxy resin, an acrylic resin, and a resin containing one or more of these resins. The encapsulant 48 may be formed of a single layer or may include a plurality of layers. The encapsulant 48 may contain light scattering particles such as titanium oxide, silicon oxide, zirconium oxide and aluminum oxide, dispersed in the encapsulant.

The encapsulant 48 includes the phosphor 68. The phosphor 68 may include a single type of phosphor or multiple types of phosphors. With multiple types of phosphors used for the phosphor 68, color rendering property and the like of the light-emitting device 100 can be increased. The first phosphor 61, the second phosphor, and a green phosphor may be used for a phosphor 68. The phosphor 68 preferably has a broad full width at half maximum, for example, $(Y,Lu,Gd)_3(Al,Ga)_5O_{12}$:Ce, more preferably has a mixture of $(Y,Lu,Gd)_3(Al,Ga)_5O_{12}$:Ce and $(Sr,Ca)AlSiN_3$:Eu. This configuration allows the light-emitting device to have a high color rendering property. The phosphor 68 is preferably a phosphor that emits light having the same wavelength as the first phosphor 61 and/or the second phosphor, or a phosphor that emits light having the shorter wavelength than the first phosphor 61 and/or the second phosphor. Hence, the ratio of the light to be absorbed by the phosphor 68 against the light emitted from the first phosphor 61 and the second phosphor can be decreased.

The amount of light scattering particles and/or the phosphor is, for example, preferably in a range of approximately 5 wt % to 60 wt % of the total weight of the encapsulant 48.

Other than a resin material, the encapsulant 48 may be formed by a sintered body of ceramic, glass, a phosphor, and the like. These materials can improve reliability of the light-emitting device for a high-output light-emitting device. In the case of a high-output light-emitting device, the first light-transmissive member 15, the second light-transmissive member 25, and the third light-transmissive member 35, and the encapsulant 48 may be formed by a sintered body of ceramic, glass, a phosphor, or the like.

Package

The package 1 is a base to dispose the light-emitting element. The package 1 includes a base member and a plurality of leads 50. The base member of the package 1 includes, for example, a ceramic such as aluminum oxide and aluminum nitride, a resin (for example, a silicone resin, a modified silicone resin, an epoxy resin, a modified epoxy resin, an unsaturated polyester resin, a phenolic resin, a polycarbonate resin, an acrylic resin, a trimethylpentene resin, polynorbornene resin, or hybrid resins that contain one or more of these resins), pulp, glass, and composite materials of these materials, and the like. The base member of the package 1 may have a single-layer structure or a multiple-layer structure.

In an example of the package 1, a package having the resin portion 75 and a plurality of leads 50 is suitably used, as shown in FIGS. 1A through 1C. This configuration allows the light-emitting device to have a high heat dissipation at low cost. In the light-emitting device 100 shown in FIG. 1A, at an outer side surface of the package 1, the plurality of leads 50 do not extend outwardly from resin portion 75, however, the light-emitting device according to the present disclosure is not limited to this configuration. That is, at the outer side surface of the package 1, the plurality of leads 50 may extend outwardly from the resin portion 75. This configuration can efficiently dissipate heat generated by the light-emitting element.

The outer shape of the package 1 and the opening of the recess 2 may be formed into a shape such as a rectangle, a polygon other than a rectangle, a circle, and an ellipse in a top view. Also, a portion of the opening of the recess 2 may be deformed such that in the case of the recess 2 having a rectangular shape, a corner of the rectangular shape of the opening is rounded. Hence, the portion of the opening can serve as an anode mark or a cathode mark to show a polarity of leads.

In another example of the package 1, a package including a substrate 7 having a flat-sheet shape and the frame-shaped resin portion 75 that is constituted with a light reflective resin disposed on the substrate 7 may be used, as shown in FIGS. 3A and 3B. FIG. 3A is a schematic top view of the light-emitting device 200 and FIG. 3B is a schematic end view taken along the line 3B-3B in FIG. 3A. In FIG. 3A, the encapsulant 48, the first light-transmissive member 15, the second light-transmissive member 25, and the third light-transmissive member 35 are omitted. The frame-shaped resin portion 75 serves as a reflector to reflect light and a wall to fill the encapsulant 48. The substrate 7 includes a plurality of wires (for example, a first wire 51a, a second wire 52a, a third wire 53a, and a fourth wire 54a) on an upper surface. The package 1 has a size that is appropriately set according to the number of light-emitting elements to be disposed, purposes, and applications. Suitable materials for the substrate 7 are insulating materials that are unlikely to allow light from the first light source and the like or external light to pass through the material. Also, a reflective member may be disposed on an element mounting surface to increase light reflectivity of the package 1. The reflective member is, for example, a mixture of reflective particles such as titanium oxide and an organic or a nonorganic binder. The reflective member is, for example, a white resist, a white ink, and a ceramic ink. For the organic binder, a silicone resin that has good resistance to heat and light is particularly preferable. This configuration allows light to be reflected on the surface of the substrate 7. Hence, the light-emitting device having a high light extraction efficiency is provided.

The third light source 30a is preferably located between the first light source 10a and the second light source 20a in a top view. This allows light from the third light source 30a to be emitted toward both the first light source 10a and the second light source 20a and color mixing property of the light-emitting device 100 can be increased. The first light source 10a, the second light source 20a, and the third light source 30a may be disposed such that a light source group formed with same light sources is aligned in a row in the X direction or the Y direction or aligned concentrically.

The package 1 may not include the recess 2. For example, the package 1 may be a substrate having a flat-sheet shape. The substrate having a flat-sheet shape may be either a flexible substrate manufacturable by roll-to-roll system or a rigid substrate. Suitable materials for the flexible substrate are, for example, insulating materials such as polyimide, polyethylene terephthalate, and polyethylene naphthalate. The substrate having a flat-sheet shape has a thickness of, for example, approximately 10 µm to 200 µm.

Plurality of Leads

The plurality of leads 50 have electroconductivity and function as electrodes to supply electricity to the light-emitting element. Examples of a base material for the plurality of leads 50 include a metal such as copper, aluminum, gold, silver, iron, nickel or an alloy of these metals, phosphor bronze, and copper-iron alloys. These metals may have a single layer or multiple layer structure (for example, a clad material). Particularly, for the base material, copper is preferable because of low cost and high heat dissipation performance. Also, the plurality of leads 50 may include a metal layer on a surface of the base material. The metal layer includes, for example, silver, aluminum, nickel, palladium, rhodium, gold, copper, and an alloy of these metals. The metal layer may be disposed on a whole surface or on a portion of the surface of the plurality of leads 50. The metal layer made of silver or the like formed on an upper surface of the leads may have a larger thickness than the thickness of the metal layer made of silver or the like formed on a lower surface of the leads. This configuration allows the metal layer made of silver or the like formed on the upper surface of the leads to have high flatness. Hence, light emitted from the light-emitting element can be effectively reflected upward. Further, by decreasing the thickness of the metal layer made of silver or the like formed on a lower surface of the leads, the cost of the light-emitting device 100 can be decreased. Also, the metal layer may include a layer on the upper surface of the lead that is different from a layer on the lower surface of the lead. For example, the metal layer on the upper surface of the lead may have a multilayered structure that contains metal layers of nickel and silver, and the metal layer on the lower surface of the lead may be a metal layer that does not contain nickel.

In the case in which a metal layer containing silver is formed on an outermost surface of the plurality of leads 50, a protective layer such as silicon oxide and the like is preferably formed on a surface of the metal layer containing silver. This can prevent the metal layer containing silver from being discolored by components in the air such as sulfur. The protective layer can be deposited by a deposition method using a vacuum process, such as sputtering for example, or by another known method.

The plurality of leads 50 include at least four leads. A light-emitting device having four leads is shown in FIG. 4. With the plurality of leads 50 including at least four leads, the first light source 10a, the second light source 20a, and the third light source 30a can be independently operated. A plurality of leads 50 may include five or more leads. The plurality of leads 50 may include a heat dissipating portion to function as a heat dissipating member other than an electrode portion to function as an electrode.

Resin Portion

For a resin material to serve as a base material of the resin portion 75, a thermosetting resin, a thermoplastic resin, and the like may be used. Specifically, examples of the base material include an epoxy resin compound, a silicone resin compound, a modified epoxy resin compound such as a silicone-modified epoxy resin, a modified silicone resin compound such as epoxy-modified silicone resin, an unsaturated polyester resin, a saturated polyester resin, a polyimide resin compound, a modified polyimide resin compound, cured products of the above resin compounds, polyphthalamide (PPA), polycarbonate resin, polyphenylene sulfide (PPS), a liquid crystal polymer (LCP), a resin such as an ABS resin, a phenolic resin, an acrylic resin and a PBT resin. Particularly, a thermosetting resin such as an epoxy resin compound and a silicone resin compound is preferably used. Also, for the resin portion 75, a silicone resin compound having good resistance to heat and light (for example, SMC resin) is preferably used.

The resin portion 75 preferably contains a light-reflecting substance in the above resin material to serve as the base material. The light-reflective substance is preferably a member that is unlikely to absorb light from the light-emitting element and has a large difference in refractive index against the resin material to serve as the base material. Examples of such light-reflective substances include titanium oxide, zinc oxide, silicon oxide, zirconium oxide, aluminum oxide, and aluminum nitride. The resin portion 75 containing the light-reflecting substance can efficiently reflect light from the light-emitting element.

In order to improve contrast of the light-emitting device 100, the resin portion 75 may contain a filler that has a low light reflectivity with respect to external light (in many cases, sunlight) of the light-emitting device 100. In this case, the resin portion 75 has, for example, a black color or a color close to black. For the filler, carbon black such as acetylene black, activated carbon, and graphite, transition metal oxide such as iron oxide, manganese dioxide, cobalt oxide, and molybdenum oxide, or colored organic pigments can be used according to purposes.

The light-emitting device in the present disclosure may not include the package 1. FIG. 5A is a schematic top view of the light-emitting device 300 and FIG. 5B is a schematic end view taken along the line 5B-5B in FIG. 5A. The light-emitting device 300 shown FIGS. 5A and 5B does not include the package 1. The light-emitting device 300 includes the first light source 10a, the second light source 20a, the third light source 30a, a light-guiding member 8 disposed on a lateral surface of each light source, a reflective material 76 that covers an outer surface of the light-guiding member 8, and the encapsulant 48 that covers the first light source 10a, the second light source 20a, and the third light source 30a. Also, the first light source 10a includes the first light-emitting element 10 and the first light-transmissive member 15 disposed on the upper surfaces of the first light-emitting element 10. The second light source 20a includes the second light-emitting element 20 and the second light-transmissive member 25 disposed on the upper surface of the second light-emitting element 20. The third light source 30a includes the third light-emitting element 30 and the third light-transmissive member 35 disposed on the upper surface of the third light-emitting element 30. The first light-transmissive member 15 contains the first phosphor 61. The second light-transmissive member 25 contains substantially no phosphor. The third light-transmissive member 35 includes the green phosphor 65.

The light-guiding member 8 covers a lateral surface of each light-emitting element and guides light emitted from the lateral surface of each light-emitting element toward an upper surface direction of the light-emitting device. The light-guiding member 8 disposed on the lateral surface of the light-emitting element can suppress reflection of a portion of light that reaches the lateral surface of the light-emitting element. This can suppress a decrease of light emitted from the light-emitting element. In the light-emitting device 300 shown in FIGS. 5A and 5B, the light-guiding member 8 covers the upper surface in addition to the lateral surface of the light-emitting element. The light-guiding member 8 is, for example, a member containing resin material as a base material. Suitable materials for the resin material include, for example, a light transmissive resin such as a silicone resin, a silicone modified resin, an epoxy resin, and a phenolic resin. The light-guiding member 8 preferably has a high light transmissivity. Hence, the light-guiding member 8 preferably contains no substance that reflects, absorbs, or scatters light. For the light-guiding member 8, a member that has a higher light transmissivity of light from the light-emitting element than that of the reflective material 76 is selected.

The reflective material 76 forms an external surface of the light-emitting device 300. The reflective material 76 has a good light reflectivity that can efficiently reflect light from the light-emitting element. The reflective material 76 is, for example, a white member. A member that is the same as the resin portion 75 can be used for the reflective material 76. In the light-emitting device 300 shown in FIGS. 5A and 5B, the reflective material 76 covers the outer surface of the light-guiding member 8 disposed on the lateral surface of each light-emitting element and a portion of the lateral surface of each light-emitting element. The reflective material 76 disposed at a lateral side of the light-emitting element can reflect a portion of light that is emitted from the light-emitting element and propagates to the lateral side. With this configuration, light can be efficiently extracted upward. The reflective material 76 preferably covers the lower surface of the light-emitting element. This allows, for example, light emitted downward from the light-emitting element to be reflected upward. Also, as the reflective material 76 covers the lower surface of the light-emitting element, adhesion strength between the light-emitting element and the reflective material 76 can be increased.

Comparing a difference in thermal expansion rate between the light-guiding member 8 and each light-emitting element (hereinafter referred to as "a first thermal expansion difference ΔT30") and a difference in thermal expansion rate between the reflective material 76 and each light-emitting element (hereinafter referred to as "a second thermal expansion difference ΔT40"), for example, a resin material that satisfies a relation of ΔT40<ΔT30 is selected for the reflective material 76. This can inhibit the light-guiding member 8 from being detached from each light-emitting element.

Protective Element

The light-emitting device 100 can include a protective element to improve electrostatic discharge resistance. One or more protective elements may be included. For example, one protective element may be disposed for one light-emitting element in the light-emitting device 100. In the light-emitting device 100, each light-emitting element has a different conductive path. Hence, with the protective element disposed for each light-emitting element, electrostatic discharge resistance of the light-emitting device 100 can be increased.

Second Embodiment

FIG. 6A is a schematic top view of the light-emitting device 400 according to a second embodiment. FIG. 6B is a schematic bottom view of the light-emitting device 400. FIG. 7 is a schematic top view of the light-emitting device 400 shown in FIG. 6A in which the first resin portion 75a, the second resin portion 75b, and the encapsulant 48 are omitted. FIG. 8A is a schematic end view taken along the line 8A-8A in FIG. 6A. FIG. 8B is a schematic end view taken along the line 8B-8B in FIG. 6A. FIG. 8C is a schematic end view taken along the line 8C-8C in FIG. 6A. In FIG. 7, an outer edge of the first resin portion 75a is shown in dashed lines.

The light-emitting device 400 according to the second embodiment and the light-emitting device 100 according to the first embodiment differ in the shape of the package 1 and differ in that the light-emitting device 400 further includes a fourth light source 40a. Thus, the package 1 and the fourth light source 40a of the light-emitting device 400 according to the second embodiment will mainly be described.

The package 1 of the light-emitting device 400 includes a first lead 51 and a second lead 52 that serve as feeding terminals of the first light source 10a, a third lead 53 and a fourth lead 54 that serve as feeding terminals of the second light source 20a, a fifth lead 55 and a sixth lead 56 that serve as feeding terminals of the third light source 30a, and a seventh lead 57 and an eighth lead 58 that serve as feeding terminals of the fourth light source 40a. On an upper surface of a ninth lead 59, the first light source 10a, the second light source 20a, the third light source 30a, and the fourth light source 40a are disposed to serve as a heat dissipation member that dissipates heat generated from each light source. As shown in FIG. 8C, each lead may have a bent shape. This form allows the first resin portion 75a to enter into the lower surface of the leads. Hence, the adhesion strength between the plurality of leads and the first resin portion 75a is increased. The light-emitting device 400 shown in FIG. 6A and the like includes nine leads, however, the light-emitting device according to the present disclosure is not limited to this configuration. The light-emitting device 400 may include at least five leads.

As shown in FIGS. 8A through 8C, the package 1 of the light-emitting device 400 includes a base 90 having a plurality of leads and a first resin portion 75a that is integrally formed with the plurality of leads, and a second resin portion 75b having a frame shape disposed on an upper surface of the base 90. Also, a recess 2 is formed with an inner lateral wall of the second resin portion 75b and the upper surface of the base 90. On the upper surface of the base 90, the upper surface of the first resin portion 75a and the upper surfaces of the plurality of leads are formed in a substantially same plane. Also, on the lower surface of the base 90, the lower surface of the first resin portion 75a and the lower surfaces of the plurality of leads are formed in a substantially same plane.

The light-emitting device 400 includes a first light source group X1 having a plurality of first light sources 10a, the second light source group X2 having a plurality of second light sources 20a, a third light source group X3 having a plurality of third light sources 30a, and a fourth light source group X4 having a plurality of fourth light sources 40a. The first light source group X1, the second light source group X2, the third light source group X3, and the fourth light source group X4 are connected in parallel. This configuration allows for individual setting of a current level flowing to each of the first light source group X1, the second light source group X2, the third light source group X3, and the fourth light source group X4. Also, in one light source group, each light source is connected in series. With the light source group each including a plurality of light-emitting elements, a bright light-emitting device can be provided. In the light-emitting device 400, the number of the first light source 10a and the like may be one.

When only the first light source group X1 is operated, the light from the first light source group X1 and the light from the phosphor 68 in the encapsulant 48 are mixed. Hence, for example, the light-emitting device 400 can emit light with an emission color in a color temperature range of 2000 K to 3500 K. When only the second light source group X2 is operated, the light from the second light source group X2 and the light from the phosphor 68 in the encapsulant 48 are mixed. Hence, for example, the light-emitting device 400 can emit light with an emission color in a color temperature range of 5000 K to 7500 K. The third light source group X3 is a light source that emits green light, and the fourth light source group X4 is a light source that emits red light. The third light source group X3 and the fourth light source group X4 are used as an auxiliary light source to adjust chromaticity of the light-emitting device 400.

The fourth light source 40a shown in FIG. 8B includes a fourth light-emitting element 40 that has a peak emission wavelength in a range of 430 nm to 480 nm and a fourth light-transmissive member 45 that contains a red phosphor 67 and disposed on an upper surface of the fourth light-emitting element 40. For the red phosphor 67, for example, a red phosphor having a composition represented by (Sr,Ca)AlSiN$_3$:Eu may be used. The fourth light source 40a may be a red light-emitting element having a peak emission wavelength in a range of 630 nm to 660 nm.

FIG. 9 is a diagram showing a chromaticity of a light-emitting device in the 1931 CIE chromaticity diagram when the current level to light source group each is changed while the total amount of current applied to the light emission device 400 is kept constant. In FIG. 9, the chromaticity of the light-emitting device 400 when only the first light source group X1 is operated is shown as a first chromaticity point P. The chromaticity of the light-emitting device 400 when only the second light source group X2 is operated is shown as a second chromaticity point Q. The chromaticity of the light-emitting device 400 when only the third light source group X3 is operated is shown as a third chromaticity point R. The chromaticity of the light-emitting device 400 when only the fourth light source group X4 is operated is shown as a fourth chromaticity point S. The first chromaticity point P, the second chromaticity point Q, the third chromaticity point R, and the fourth chromaticity point S each has a different chromaticity each other. The third chromaticity point R has a y-value higher than a y-value on the line D that passes through the first chromaticity point P and the second chromaticity point Q. The fourth chromaticity point S has a y-value lower than a y-value on the line D that passes through the first chromaticity point P and the second chromaticity point Q.

The light-emitting device 400 according to the second embodiment includes the third light source group X3 that emits green light and the fourth light source group X4 that emits red light. With this configuration, the chromaticity other than the chromaticity on the substantially straight line in the 1931 CIE chromaticity diagram can be expressed by adjusting the current flowing to each of the first light source group X1, the second light source group X2, the third light source group X3, and the fourth light source group X4. In other words, the light-emitting device 400 can be adjusted to reproduce an emission color at a desired chromaticity point. Specifically, with the light-emitting device 400 having the third light source group X3, the locus of the chromaticity of the light-emitting device 400 in the 1931 CIE chromaticity diagram tends to be a curve projecting in the +y direction. Also, with the light-emitting device 400 having the fourth light source group X4, the locus of the chromaticity of the light-emitting device 400 in the 1931 CIE chromaticity diagram tends to be a curve projecting in the −y direction. This allows, for example, an emission color of the light-emitting device 400 to be adjusted along the blackbody locus in the 1931 CIE chromaticity diagram.

The light-emitting device 400 according to the present disclosure may include a light source to which current is not applied. For example, as in the case of the first chromaticity point P and the second chromaticity point Q, current is applied only to the first light source 10a or the second light source 20a and is not applied to other light sources.

The fourth light source 40a is not limited to a light source that emits red light. That is, in the 1931 CIE chromaticity diagram, when only the fourth light source 40a is operated, the fourth chromaticity point S of the fourth light source 40a may have a y-value lower than a y-value on the line D that passes through the first chromaticity point P and the second chromaticity point Q, which are the chromaticity points when only the first light source 10a is operated and when only the second light source 20a is operated, respectively. In this case, the terms "having a y-value lower than a y-value on the line D" means that the fourth chromaticity point S is located downward from the line D in the 1931 CIE chromaticity diagram.

In the 1931 CIE chromaticity diagram, an absolute value of Duv of the light-emitting device 400 from the first chromaticity point P to the second chromaticity point Q is preferably 0.02 or smaller. Hence, a color difference at the same color temperature between the emission color of the light-emitting device 400 and the emission color on the blackbody locus becomes small, and the light-emitting device having a high-quality emission color can be provided.

The light-emitting device 400 includes a first protective element 11 connected to the first light source group X1, a second protective element 12 connected to the second light source group X2, a third protective element 13 connected to the third light source group X3, and a fourth light source group 14 connected to the fourth light source group X4. A protective element provided for each light source group can increase electrostatic discharge resistance of the light-emitting device 400.

Note that characteristic parts of the light-emitting device shown in the first and second embodiments are suitably applicable to other embodiments of the present disclosure.

The invention claimed is:

1. A light-emitting device comprising:
   a first light source comprising a first light-emitting element having a peak emission wavelength in a range of 430 nm to 480 nm;
   a second light source comprising a second light-emitting element having a peak emission wavelength in a range of 430 nm to 480 nm;
   a third light source; and
   an encapsulant containing a phosphor and covering the first light source, the second light source, and the third light source,
   wherein the first light source, the second light source, and the third light source are connected in parallel, and
   wherein, in a 1931 CIE chromaticity diagram, the light-emitting device has:
      a first chromaticity point when only the first light source is operated,
      a second chromaticity point different from the first chromaticity point when only the second light source is operated, and
      a third chromaticity point when only the third light source is operated, the third chromaticity point having a y-value larger than a y-value on a straight line passing the first chromaticity point and the second chromaticity point.

2. The light-emitting device according to claim 1, wherein the first light source comprises a first light-transmissive member disposed on an upper surface of the first light-emitting element, the first light-transmissive member containing a first phosphor.

3. The light-emitting device according to claim 1, wherein the second light source comprises a second light-transmissive member disposed on an upper surface of the second light-emitting element.

4. The light-emitting device according to claim 3, wherein the second light-transmissive member contains substantially no phosphor.

5. The light-emitting device according to claim 1, wherein the third light source comprises a green light-emitting element configured to emit green light.

6. The light-emitting device according to claim 1, wherein the third light source comprises a third light-emitting element having a peak emission wavelength in a range of 430 nm to 480 nm, and a third light-transmissive member containing a green phosphor and being disposed on an upper surface of the third light-emitting element.

7. The light-emitting device according to claim 1, further comprising:
a fourth light source,
wherein a fourth chromaticity point has a y-value lower than a y-value on a straight line passing the first chromaticity point and the second chromaticity point when only the fourth light source is operated.

8. The light-emitting device according to claim 7, wherein the fourth light source comprises a red light-emitting element to emit red light.

9. The light-emitting device according to claim 7, wherein the fourth light source comprises a fourth light-emitting element having a peak emission wavelength in a range of 430 nm to 480 nm, and a fourth light-transmissive member containing a red phosphor and being disposed on an upper surface of the fourth light-emitting element.

10. The light-emitting device according to claim 1, wherein an absolute value of Duv of the light-emitting device from the first chromaticity point to the second chromaticity point is 0.02 or less in the 1931 CIE chromaticity diagram.

11. A light-emitting device comprising:
a first light source comprising a first light-emitting element having a peak emission wavelength in a range of 430 nm to 480 nm;
a second light source comprising a second light-emitting element having a peak emission wavelength in a range of 430 nm to 480 nm;
a third light source that emits light having a peak emission wavelength in a range of 490 nm to 570 nm; and
an encapsulant containing a phosphor and covering the first light source, the second light source, and the third light source,
wherein the first light source, the second light source, and the third light source are connected in parallel,
wherein the light-emitting device has a color temperature in a range of 2000 K to 3500 K when only the first light source is operated, and
wherein the light-emitting device has a color temperature in a range of 5000 K to 7500 K when only the second light source is operated.

12. The light-emitting device according to claim 11, wherein the first light source comprises a first light-transmissive member disposed on an upper surface of the first light-emitting element, the first light-transmissive member containing a first phosphor.

13. The light-emitting device according to claim 11, wherein the second light source comprises a second light-transmissive member disposed on an upper surface of the second light-emitting element.

14. The light-emitting device according to claim 13, wherein the second light-transmissive member contains substantially a second phosphor.

15. The light-emitting device according to claim 11, wherein the third light source comprises a green light-emitting element to emit green light.

16. The light-emitting device according to claim 11, wherein the third light source comprises a third light-emitting element having a peak emission wavelength in a range of 430 nm to 480 nm, and a third light-transmissive member containing a green phosphor and being disposed on an upper surface of the third light-emitting element.

17. The light-emitting device according to claim 11, further comprising:
a fourth light source,
wherein the fourth light source comprises a red light-emitting element to emit red light.

18. The light-emitting device according to claim 11, further comprising:
a fourth light source,
wherein the fourth light source comprises a fourth light-emitting element having a peak emission wavelength in a range of 430 nm to 480 nm, and a fourth light-transmissive member containing a red phosphor and being disposed on an upper surface of the fourth light-emitting element.

* * * * *